(12) United States Patent
Ilzhoefer

(10) Patent No.: US 9,406,827 B2
(45) Date of Patent: Aug. 2, 2016

(54) HOLDER FOR A SOLAR PANEL

(71) Applicant: Werner Ilzhoefer, Hassfurt (DE)

(72) Inventor: Werner Ilzhoefer, Hassfurt (DE)

( * ) Notice: Subject to any disclaimer, the term of this patent is extended or adjusted under 35 U.S.C. 154(b) by 89 days.

(21) Appl. No.: 14/377,399

(22) PCT Filed: Jan. 24, 2013

(86) PCT No.: PCT/EP2013/051373
§ 371 (c)(1),
(2) Date: Aug. 7, 2014

(87) PCT Pub. No.: WO2013/120677
PCT Pub. Date: Aug. 22, 2013

(65) Prior Publication Data
US 2014/0360951 A1    Dec. 11, 2014

(30) Foreign Application Priority Data

Feb. 13, 2012  (DE) ............... 20 2012 001 369 U
May 3, 2012   (DE) ............... 20 2012 004 333 U
May 21, 2012  (DE) .................. 10 2012 208 480

(51) Int. Cl.
| | |
|---|---|
| *H01L 31/042* | (2014.01) |
| *F24J 2/52* | (2006.01) |
| *H01L 31/048* | (2014.01) |
| *F16M 13/00* | (2006.01) |

(Continued)

(52) U.S. Cl.
CPC .............. *H01L 31/048* (2013.01); *F16M 7/00* (2013.01); *F16M 13/00* (2013.01); *F24J 2/523* (2013.01); *F24J 2/5233* (2013.01); *F24J 2/5239* (2013.01); *F24J 2/5254* (2013.01); *H02S 20/24* (2014.12); *H02S 20/30* (2014.12); *F24J 2/526* (2013.01); *F24J 2002/4661* (2013.01); *F24J 2002/5288* (2013.01); *F24J 2002/5486* (2013.01); *Y02B 10/20* (2013.01); *Y02E 10/47* (2013.01)

(58) Field of Classification Search
CPC .......... H02S 20/24; H02S 24/30; F24J 2/523; F24J 2/5233; F24J 2/5239; F24J 2/5254; F24J 2002/4661; F24J 2002/5288; F24J 2002/5486; H01L 31/048; F16M 7/00; F16M 13/00

See application file for complete search history.

(56) References Cited

U.S. PATENT DOCUMENTS

| | | | |
|---|---|---|---|
| 6,370,828 B1 | 4/2002 | Genschorek | |
| 8,558,101 B2 * | 10/2013 | Mascolo | F24J 2/4636 136/243 |

(Continued)

FOREIGN PATENT DOCUMENTS

| | | |
|---|---|---|
| DE | 20 2008 000 997 U1 | 6/2008 |
| DE | 20 2007 006 094 U1 | 10/2008 |

(Continued)

OTHER PUBLICATIONS

PCT, "International Search Report for International Application No. PCT/EP2013/051373".

*Primary Examiner* — Stanton L Krycinski
(74) *Attorney, Agent, or Firm* — Manabu Kanesaka

(57) ABSTRACT

A holder for a solar module has a rectangular frame which has a peripheral side wall from at least one side of which there extends a leg that is directed toward the frame interior. The holder has a base plate with two receiving elements extending therefrom for receiving the leg. Each receiving element is assigned at least one support surface, attached to the base plate, for supporting the side wall, the spacing of said support surface from the receiving element being variable.

15 Claims, 4 Drawing Sheets

(51) Int. Cl.
  *F16M 7/00* (2006.01)
  *H02S 20/30* (2014.01)
  *H02S 20/24* (2014.01)
  *F24J 2/54* (2006.01)
  *F24J 2/46* (2006.01)

(56) References Cited

U.S. PATENT DOCUMENTS

| | | | | |
|---|---|---|---|---|
| 8,726,897 | B2 * | 5/2014 | Wallgren | F24J 2/4638 126/571 |
| 2007/0144575 | A1 | 6/2007 | Mascolo et al. | |
| 2008/0310913 | A1 | 12/2008 | Urban et al. | |
| 2011/0108083 | A1 * | 5/2011 | Ravestein | F24J 2/5237 136/244 |
| 2012/0167364 | A1 | 7/2012 | Koch et al. | |

FOREIGN PATENT DOCUMENTS

| | | | | |
|---|---|---|---|---|
| DE | 20 2009 003 124 U1 | 6/2009 | | |
| DE | EP 2080965 A2 * | 7/2009 | ............ | F24J 2/5203 |
| DE | 20 2008 009 241 U1 | 12/2009 | | |
| DE | 20 2009 016 197 U1 | 4/2010 | | |
| DE | 10 2009 022 746 A1 | 5/2011 | | |
| DE | 10 2010 022 556 B3 | 6/2011 | | |
| DE | 10 2010 024 514 A1 | 12/2011 | | |
| DE | 20 2011 108 873 U1 | 3/2012 | | |
| EP | 2 012 365 A1 | 1/2009 | | |
| EP | 2 402 679 A2 | 1/2012 | | |
| FR | 2983570 A1 * | 6/2013 | ............ | F24J 2/5245 |
| JP | 2003-035016 A | 2/2003 | | |
| JP | 4202401 B1 * | 12/2008 | ............ | F24J 2/5233 |
| WO | 02/073703 A2 * | 9/2002 | | |
| WO | WO 2008105296 A1 * | 9/2008 | ............ | F24J 2/5235 |
| WO | 2011/054943 A1 | 5/2011 | | |
| WO | 2012/014203 A2 | 2/2012 | | |

* cited by examiner ns to the spacing of the one face adjacent thereto from the base plate. In other words, as a result of the provision of a support bar configured in such a way, the leg is supported not only via the one face of the receiving elements, but additionally also by the support bar extending in between. In this way, improved load transmission from the solar module to the holder is achieved. The proposed holder thus allows the frame to be received in a particularly stable manner.

HOLDER FOR A SOLAR PANEL

CROSS-REFERENCES TO RELATED APPLICATIONS

This application is the National Stage of International Application No. PCT/EP2013/051373, filed Jan. 24, 2013, which claims priorities from German Application No. 20 2012 001 369.6, filed Feb. 13, 2012, German Application No. 20 2012 004 333.1, filed May 3, 2012, and German Application No. 10 2012 208 480.0, filed May 21, 2012.

BACKGROUND OF THE INVENTION (1) Field of the Invention

The invention relates to a holder for a solar module.

(2) Description of Related Art Including Information Disclosed Under 37 CFR 1.97 and 1.98

Such a holder is known from WO 2011/054943 A1. The known holder is adapted to the frame geometry of the solar module that is used in each case. On account of the multiplicity of different frame geometries, a multiplicity of holders corresponding thereto have to be produced and kept available. This is complicated, inconvenient and expensive.

BRIEF SUMMARY OF THE INVENTION

It is the object of the invention to eliminate the disadvantages of the prior art. In particular, a holder which is suitable for receiving a multiplicity of different frame geometries of solar modules is intended to be specified. According to a further aim of the invention, the holder should be producible as easily and cost-effectively as possible. Furthermore, it should be possible to mount the solar module as quickly and easily as possible on the holder.

The invention proposes that each receiving element is assigned at least one support surface, attached to the base plate, for supporting the side wall, the spacing of said support surface from the receiving element being variable. The provision proposed according to the invention of a support surface for supporting the side wall, the spacing of said support surface from the receiving element being variable, allows the holder to be used to receive different frame geometries of solar modules. Consequently, only one holder has to be produced and kept available for a multiplicity of differently configured frame geometries. The proposed holder is universal.

Expediently, the receiving element has a slot for introducing the leg. The slot is bounded by two faces. One face of the slot is expediently inclined at an angle of 10° to 40°, preferably 15° to 25°, to the base plate. The inclination of the one face of the slot corresponds substantially to the desired inclination of the solar module to be erected using the holder according to the invention. The other face of the slot expediently does not extend parallel to the one face. It can extend approximately parallel to the base plate such that the slot opens in a V-shaped manner. This makes it possible to introduce the leg of the frame into the slot in a manner approximately parallel to the base plate and subsequently to pivot said leg such that it substantially rests against the one face. In this way, at the same time one side wall of the frame is pivoted such that it passes into the region of the support surface and is supported there. In this way, the solar module is thus held securely and reliably in the pivoted state in the holder. The fixing of the solar module by simple insertion and subsequent pivoting can be carried out quickly and easily. In particular no fastening means are required for this purpose.

According to a further particularly advantageous configuration of the invention, at least one pointed protrusion extends from the one face in the direction of the opposing other face. Advantageously, a plurality of pointed protrusions extend in the direction of the opposing other face. The proposed pointed protrusions serve to perforate a coat of paint or anodic coating or some other coating provided optionally on the leg, such that electrical contact is established between the holder and the frame. This allows undesired static charges to be conducted from the frame to ground via the holder.

According to a further advantageous configuration, a support bar that extends from the base plate may be provided between the receiving elements. Expediently, a height of the support bar correspond According to a further configuration of the invention, it is proposed that the variable support surface is formed by a plurality of tongues which are at different spacings from one end of the slot. Expediently, the tongues extend obliquely from the base plate in the direction of an opening plane formed by the slots. The tongues may be bendable back into a tongue recess, corresponding thereto, in the base plate. In this way, it is possible to introduce the frame of the solar module first of all into the slots formed by the receiving elements such that the leg is oriented approximately parallel to the base plate. By pivoting the leg in the direction of the one face of the slot, those tongues that extend under the leg of the frame are then pushed back into the tongue recesses. The longest tongue of those tongues which are not bent back into the base plate forms the support surface for supporting the side wall that is located opposite after the frame has been pivoted.

According to a further configuration of the invention, a fixed stop extends from the base plate in each case opposite the receiving element. If the tongues that act as supporting surfaces unexpectedly break or snap as a result of the exertion of a high load, the fixed stop serves as a further supporting surface. The holder is thus redundant with regard to the fastening of the solar module and thus configured in a particularly safe manner. Even in the event of the support surface in the form for example of tongues failing, as a result of the proposed fixed stop, lifting of the solar module from the holder, for example as a result of wind forces, can be avoided.

Expediently, the holder is produced in one piece from a metal sheet, in particular an aluminum or stainless steel sheet. The holder can be produced in one part in particular by means of laser cutting and edging.

The variable support surface can of course also be configured in some other way. It may for example be a setscrew, an eccentric or elements configured in some other way which can be brought by bending into a different spacing position with respect to the end of the slot.

The invention also proposes a support device for a solar module, wherein at least one holder according to the invention is attached by way of its base plate to a profile rail. The profile rail may be for example a square tube.

Expediently, a support element for supporting the solar module on another side opposite the one side of the frame is provided at a predetermined spacing from the holder. The support element can be attached for example in a pivotable manner to the profile rail or to the frame of the solar module. By using two such support devices located next to one another, it is possible for the solar module to be mounted in the holder, be pivoted and subsequently supported obliquely by means of the support element on the other side of the frame. The support element is expediently configured such that the solar module held in the holding element is settable at an angle of 10° to 40°, preferably 15° to 25°, with regard to the profile rail by way of said support element.

According to a particularly advantageous configuration of the invention, a plurality of holders according to the invention and a plurality of support elements, which are held for example in a pivotable manner, are attached alternately to a profile rail. By using such support devices, it is possible to erect a plurality of solar modules obliquely one behind another. Such support devices are suitable in particular for erecting solar modules on flat roofs.

BRIEF DESCRIPTION OF THE SEVERAL VIEWS OF THE DRAWINGS

Exemplary embodiments of the invention are explained in more detail in the following text with reference to the drawings, in which.

DETAILED DESCRIPTION OF THE INVENTION

Figure 1:
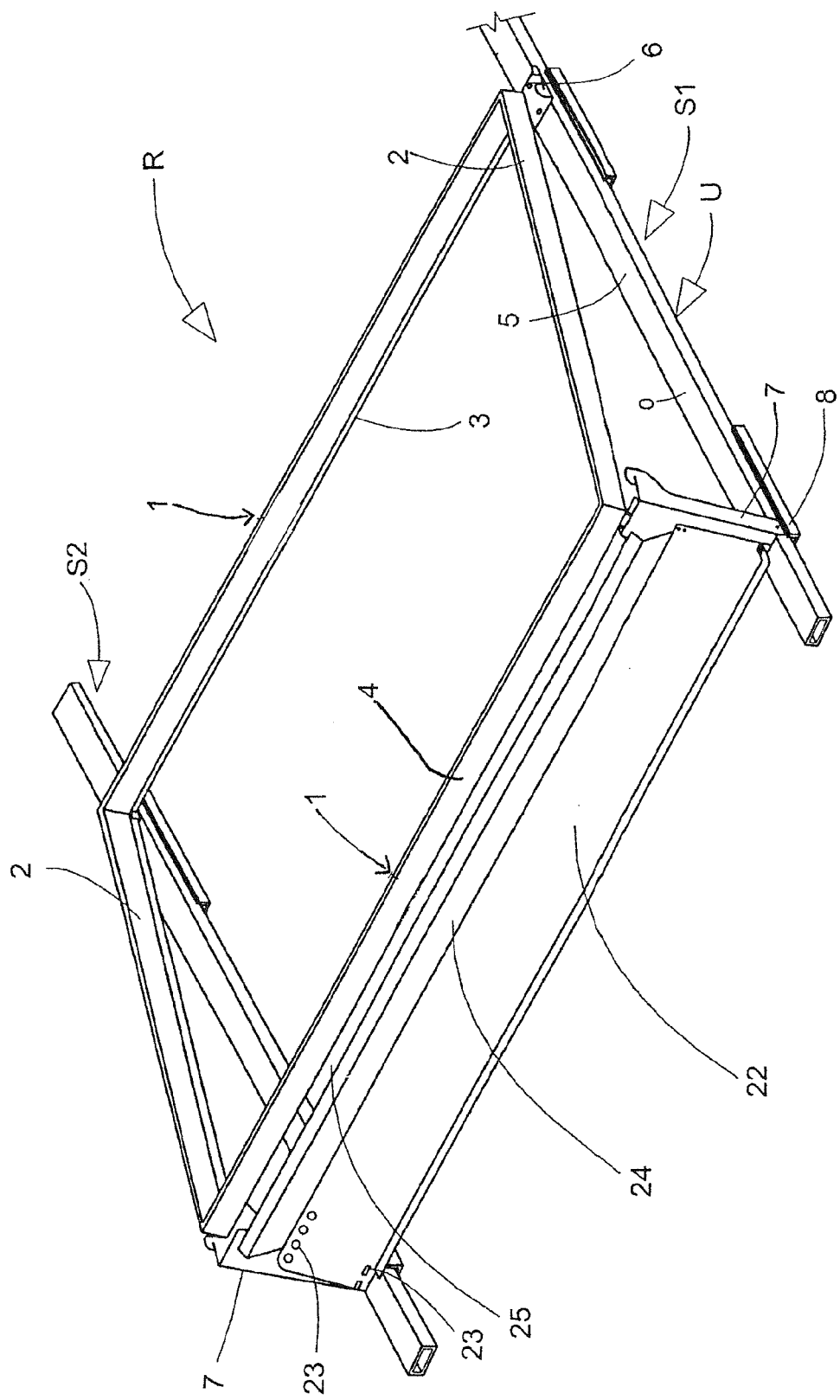
FIG. 1 shows a perspective view of a frame, erected on a support device, of a solar module.

For the sake of clarity, FIG. 1 illustrates only a rectangular frame R of a solar module (not shown here). The frame R has two first struts 1 located opposite one another and two second struts 2 located opposite one another. The second struts 2 are configured to be shorter than the first struts 1. The struts 1, 2 are each formed in the manner of a U-shaped profile, wherein a free leg 3 is directed toward a frame interior enclosed by the frame R. A peripheral side wall of the frame R is denoted by the reference sign 4.

The reference signs S1 and S2 denote support devices. Each of the support devices S1, S2 has a profile rail 5 which is formed for example from a square tube. Mounted on a top side O of the profile rail 5 is a holder 6. A support 7 is attached to the profile rail 5 in a pivotable manner at a predetermined spacing from the holder 6. The reference sign 8 denotes elastomer elements which are attached to an underside U of the profile rail 5 and are fastened for example by means of an adhesive.

Figure 2:
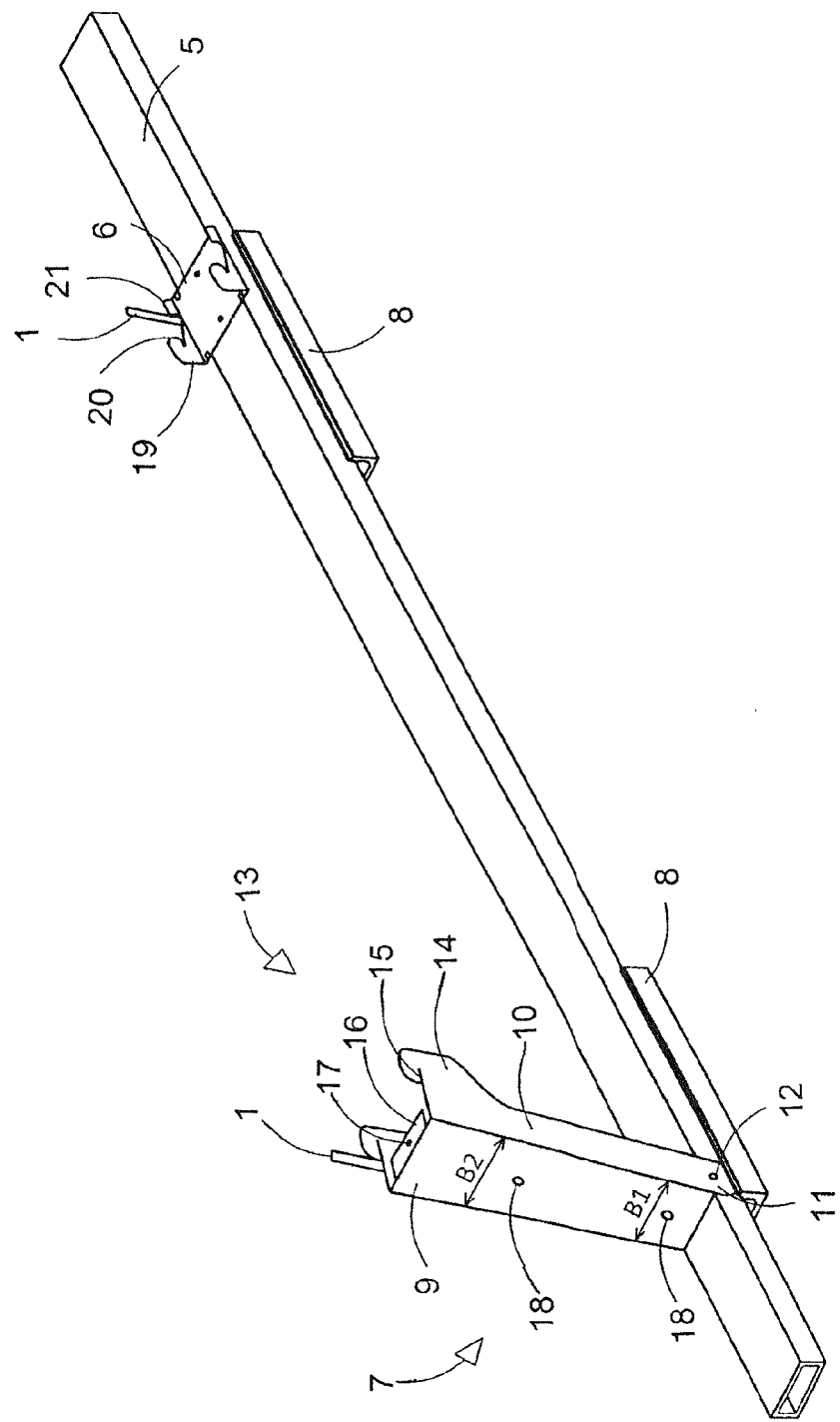
FIG. 2 shows a perspective view of a support device according to FIG. 1.

As is apparent in particular from FIG. 2, the support 7 is configured in the manner of a U-shaped profile. It has a profile base portion 9 and two legs 10 that are located opposite one another and extend therefrom. Pivot fastening portions 11 extend from each of the legs 10, said pivot fastening portions 11 having a first aperture 12 through which fastening means (not shown here) are guided such that the support 7 is held on the profile rail 5 in a pivotable manner. A first width B1 of the profile base portion 9 in the vicinity of the pivot fastening portions 11 is smaller than a second width B2 in the vicinity of a free end of the support 7. The profile base portion 9 thus has a trapezoidal shape. A fastening element 13 provided at the free end of the support 7 comprises fastening portions 14 which extend from the legs 10. Each of the fastening portions 14 has a slot 15 which opens toward the profile base portion 9.

A securing portion 16 which is formed by a tab that is bent through about 90° from the profile base portion 9 is furthermore provided at the free end of the profile base portion 9. The securing portion 16 has a second aperture 17. Reference sign 18 denotes third apertures which are provided in the profile base portion 9.

Figure 3:
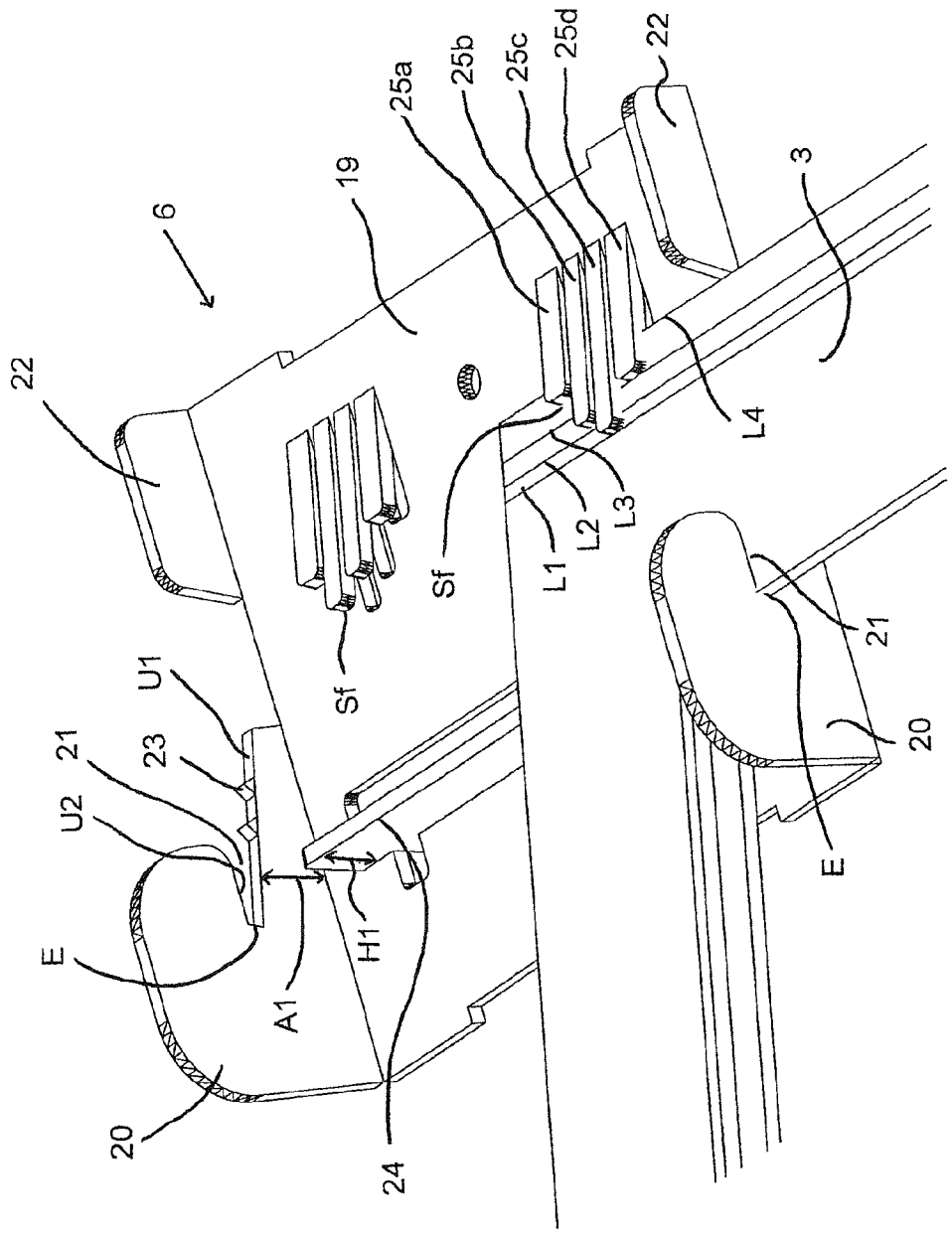
FIG. 3 shows a perspective view of a holder.

The holder 6, which is shown in particular also in FIG. 3, has a base plate 19 from which receiving elements 20 that each have a further slot 21 extend. The holder 6 is mounted on the top side O of the profile rail 5 with respect to the support 7 such that the further slot 21 opens in an opposite direction with respect to the slot 15. Provided opposite an opening of the further slot 21 is in each case a fixed stop 22. Only the leg of the frame R (which is not otherwise illustrated in more detail) is shown here by way of reference sign 3.

The one face U1 of the further slot 21 forms here approximately an angle of 20° with the base plate 19. Pointed protrusions 23 extend from the one face U1 in the direction of the opposing other face U2. The pointed protrusions 23 are expediently hardened. The hardening can be achieved by the production of the pointed protrusions 23 by means of laser cutting followed by the rapid cooling thereof. Provided between the receiving elements 20 is a support bar 24 that extends from the base plate 19. A height, denoted by way of reference sign H1, of the support bar 24 corresponds to the spacing A1 of the one face U1, adjacent thereto, from the base plate 19.

Tongues 25a, 25b, 25c and 25d extend from the base plate 19 obliquely in the direction of an opening plane formed by the further slots 21 or the legs 3 introduced into said slots 21. The tongues 25a-25d have different lengths and thus different spacings from the one end E of the further slot 21.

L1, L2, L3 and L4 indicate different frame geometries. In other words, the leg 3 can have different depths corresponding to the lines L1, L2, L3, L4. In the case of the depth L1, the side wall 4 extends from the leg 3 in the region of the line L1. In the case of the depth L1, the side wall 4 (not shown here) would thus be supported by the support surface Sf formed by the tongue 25c. In the case of a leg 3 having the depth L2, a side wall 4 extending therefrom would be supported by the support surface Sf formed by the tongue 25b. In the case of a leg 3 having the depth L4, the fixed stop 22 serves as the support surface.

In order to mount the solar module in the holder 6, first of all the leg 3 of the frame R is introduced in a manner oriented approximately parallel to the base plate 19 into the further slot 21 until it rests against the end E thereof. Then, the leg 3 is pivoted such that it comes to rest approximately against the one face U1. In the process, the pointed protrusions 23 penetrate an anodic coating or coat of paint provided on the leg 3. At the same time, depending on the depth L1-L4 of the leg 3, the tongues 25a-25d located under the leg 3 are bent back in the direction of the base plate 19. The longest of those tongues 25a-25d which are not located under the leg 3 during the pivoting thereof, remain in their obliquely bent up position and thus form a support surface Sf for supporting the side wall 4 (not shown here) extending from the leg 3.

Figure 4:
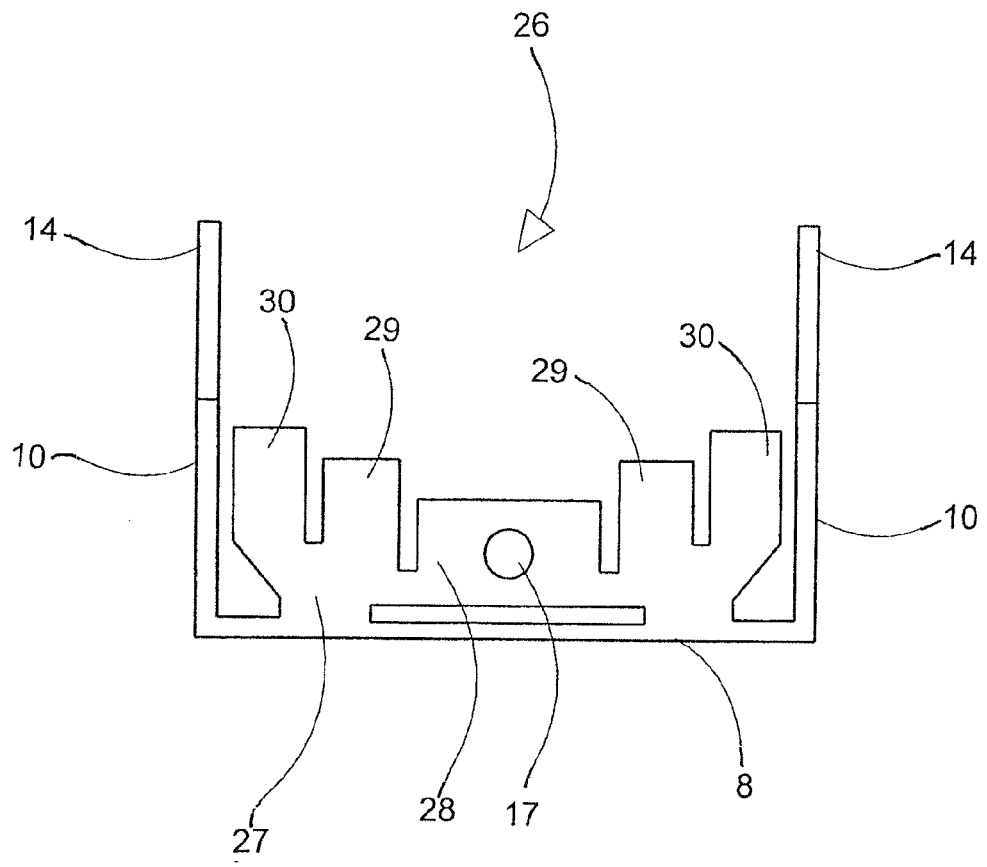
FIG. 4 shows a plan view of one configuration of the support.

FIG. 4 shows a plan view of a further support 26. The further support 26 has a further securing portion 27. The further securing portion 27 is in turn configured in a substantially symmetrical manner and has a first tongue 28 which is provided with the second aperture 17. Second tongues 29 are provided on either side of the first tongue 28 and third tongues 30 are provided on either side of the second tongues 29. The first 28, second 29 and third tongues 30 are each separated from one another by incisions. The first tongue 28 extends by a first depth in the direction of the fastening portion 14, the second tongues 29 extend by a second depth in the direction of the fastening portion 14 and the third tongues 30 extend by a third depth in the direction of the fastening portion 14. The first depth L1 is smaller than the second depth L2; the second depth L2 is smaller than the third depth L3. With the proposed configuration of the further securing portion 27, it is possible to fasten frame geometries with different configurations by means of the further support 26. By introducing a tool into the second aperture 17, it is possible for example to secure a frame R of which the leg 3 extends for example via the third tongues 30. In this case, such a frame R can be secured by bending up the first 28 and the second tongues 29. The proposed further support 26 is thus universally suitable for fastening a plurality of solar modules available on the market.

The holder 6 and the support 7 are advantageously formed from metal sheets produced by means of laser cutting, which are subsequently edged. Both the holder 6 and the support 7 are expediently manufactured in one piece.

As is apparent in particular from FIG. 1, the holder 6 and the support 7 each serve to support two adjacent solar modules. This makes the support device S1, S2 particularly efficient. They allow a multiplicity of solar modules to be erected with little mounting and production effort.

Although not shown in the figures, a plurality of holders 6 and supports 7 can be mounted alternately on a profile rail 5. In other words, a support device S1, S2 can in this case be used to support a plurality of solar modules one behind another, this further improving the efficiency of the device.

LIST OF REFERENCE SIGNS

1 First strut
2 Second strut
3 Free leg
4 Side wall
5 Profile rail
6 Holder
7 Support
8 Elastomer element
9 Profile base portion
10 Leg
11 Pivot fastening portion
12 First aperture
13 Fastening element
14 Fastening portion
15 Slot
16 Securing portion
17 Second aperture
18 Third aperture
19 Base plate
20 Receiving element
21 Further slot
22 Fixed stop
23 Pointed protrusion
24 Support bar
25a-25d Tongues
26 Further support
27 Further securing portion
28 First tongue
29 Second tongue
30 Third tongue
A1 Spacing
B1 First width
B2 Second width
E End
H1 Height
L1 First depth
L2 Second depth
L3 Third depth
L4 Fourth depth
O Top side
R Frame
S1 First support device
S2 Second support device
Sf Support surface
U Underside
U1 First face
U2 Second face

The invention claimed is:

1. A holder for a solar module having a rectangular frame which has a peripheral side wall from at least one side of which there extends a leg that is directed toward the frame interior,
wherein the holder has a base plate with two receiving elements extending therefrom for receiving the leg,
wherein each receiving element is assigned at least one support surface, attached to the base plate, for supporting the side wall, the spacing of said support surface from the receiving element being variable,
wherein the each receiving element has a slot for introducing the leg, and
wherein the support surface is formed by a plurality of tongues which are at different spacings from one end of the slot.

2. The holder as claimed in claim 1, wherein one face of the slot is inclined at an angle of 10° to 40° to the base plate.

3. The holder as claimed in claim 1, wherein at least one pointed protrusion extends from one face in the direction of an opposing other face.

4. The holder as claimed in claim 1, wherein a support bar that extends from the base plate is provided between the receiving elements.

5. The holder as claimed in claim 4, wherein a height of the support bar corresponds to the spacing of one face adjacent thereto from the base plate.

6. The holder as claimed in claim 1, wherein the tongues extend obliquely from the base plate in the direction of an opening plane formed by the slots.

7. The holder as claimed in claim 1, wherein the tongues are bendable back into a tongue recess, corresponding thereto, in the base plate.

8. The holder as claimed in claim 1, wherein a fixed stop extends from the base plate, opposing to the each receiving element.

9. The holder as claimed in claim 1, wherein the holder is produced in one piece from a metal sheet.

10. A support device for a solar module, wherein at least one holder as claimed in claim 1 is attached by way of its base plate to a profile rail.

11. The support device as claimed in claim 10, wherein a support element for supporting the solar module on another side opposite the one side of the frame is provided at a predetermined spacing from the holder.

12. The support device as claimed in claim 10, wherein a support element is configured such that the solar module held in the holder is settable at an angle of 10° to 40° with respect to the profile rail by way of said support element.

13. The holder as claimed in claim 2, wherein the one face of the slot is inclined at the angle of 15° to 25° to the base plate.

14. The holder as claimed in claim 9, wherein the holder is produced in one piece from an aluminum sheet or stainless steel sheet.

15. The support device as claimed in claim 12, wherein the support element is configured such that the solar module held in the holder is settable at the angle of 15° to 25° with respect to the profile rail by way of said support element.

* * * * *